United States Patent [19]

Gaul

[11] Patent Number: 5,668,409
[45] Date of Patent: Sep. 16, 1997

[54] INTEGRATED CIRCUIT WITH EDGE CONNECTIONS AND METHOD

[75] Inventor: Stephen Joseph Gaul, Melbourne, Fla.

[73] Assignee: Harris Corporation, Palm Bay, Fla.

[21] Appl. No.: 463,388

[22] Filed: Jun. 5, 1995

[51] Int. Cl.⁶ .................................................. H01L 23/34
[52] U.S. Cl. .......................... 257/723; 257/737; 257/778
[58] Field of Search ................................ 257/723, 737, 257/696, 778

[56] References Cited

U.S. PATENT DOCUMENTS

| | | | |
|---|---|---|---|
| 3,256,465 | 6/1966 | Weissenstern et al. | 317/101 |
| 3,343,256 | 9/1967 | Smith, et al. | 29/578 |
| 3,372,070 | 3/1968 | Zuk | 148/186 |
| 3,418,545 | 12/1968 | Hutson | 317/235 |
| 3,445,686 | 5/1969 | Rutz | 307/299 |
| 3,454,835 | 7/1969 | Rosvold | 317/101 |
| 3,456,335 | 7/1969 | Hennings et al. | 29/579 |
| 3,462,650 | 8/1969 | Hennings et al. | 317/101 |
| 3,648,131 | 3/1972 | Stuby | 317/235 R |
| 3,684,931 | 8/1972 | Taniguchi | 257/778 |
| 3,796,927 | 3/1974 | Boyle et al. | 317/235 R |
| 3,798,513 | 3/1974 | Ono | 317/235 R |
| 3,885,196 | 5/1975 | Fischer | 315/169 TV |
| 3,959,579 | 5/1976 | Johnson | 174/68.5 |
| 3,962,052 | 6/1976 | Abbas et al. | 204/129.3 |
| 3,969,745 | 7/1976 | Blocker, III | 357/22 |
| 3,982,268 | 9/1976 | Anthony et al. | 357/55 |
| 4,074,342 | 2/1978 | Honn et al. | 361/411 |
| 4,097,890 | 6/1978 | Morris et al. | 357/55 |
| 4,104,674 | 8/1978 | Lorenze, Jr. et al. | 357/30 |
| 4,188,709 | 2/1980 | Lorenze, Jr. et al. | 29/577 R |
| 4,263,341 | 4/1981 | Martyniak | 427/97 |
| 4,275,410 | 6/1981 | Grinberg et al. | 357/68 |
| 4,368,503 | 1/1983 | Kurosawa et al. | 361/414 |
| 4,379,307 | 4/1983 | Soclof | 357/68 |
| 4,467,343 | 8/1984 | Herberg | 357/38 |
| 4,528,072 | 7/1985 | Kurosawa et al. | 204/15 |
| 4,613,891 | 9/1986 | Ng et al. | 357/68 |
| 4,670,764 | 6/1987 | Benjamin et al. | 357/22 |
| 4,720,738 | 1/1988 | Simmons | 357/30 |
| 4,761,681 | 8/1988 | Reid | 357/68 |
| 4,839,510 | 6/1989 | Okabe et al. | 250/211 J |
| 4,862,322 | 8/1989 | Bickford et al. | 361/386 |
| 4,897,708 | 1/1990 | Clements | 357/65 |
| 4,954,875 | 9/1990 | Clements | 357/65 |
| 5,031,072 | 7/1991 | Malhi et al. | 257/723 |
| 5,198,695 | 3/1993 | Hanes et al. | 257/773 |
| 5,313,096 | 5/1994 | Eide | 257/686 |
| 5,362,986 | 11/1994 | Anginlli et al. | 257/723 |

Primary Examiner—Sara W. Crane
Assistant Examiner—Roy Potter
Attorney, Agent, or Firm—Jaeckle Fleischmann & Mugel, LLP

[57] ABSTRACT

A surface mountable integrated circuit is disclosed. Dies 1041 with edge connections 1080 are coupled to each other with the edge connection and to a printed circuit board 1070.

9 Claims, 4 Drawing Sheets

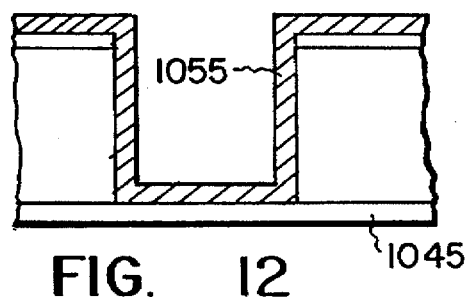
FIG. 12
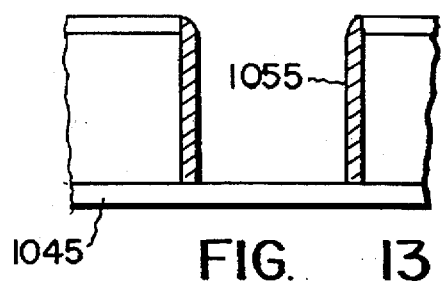
FIG. 13
FIG. 14
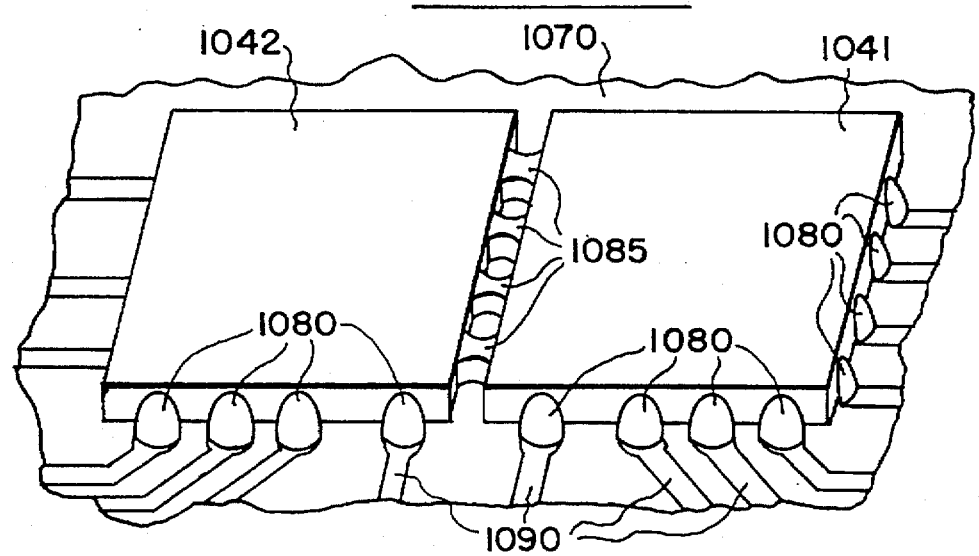
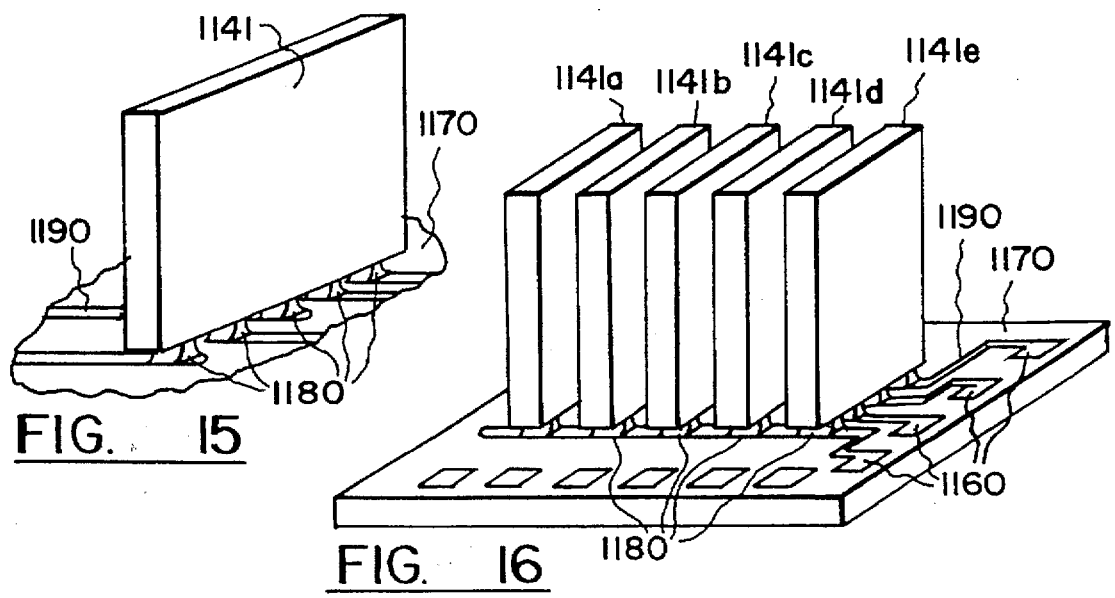
FIG. 15
FIG. 16

INTEGRATED CIRCUIT WITH EDGE CONNECTIONS AND METHOD

This application is related to applications Ser. No. 08/462.171, 08,461,951 now U.S. Pat. No. 5,646,067, 08,461,693, 08/461,037, 08,467,876, filed Jun. 5, 1995, and assigned to Harris Corporation.

BACKGROUND

Integrated circuits are formed upon semiconductor substrates known as wafers. A wafer holds a number of identical integrated circuits, each circuit being a die that is spaced from other identical circuits. Dies are separated from the wafer usually by a dicing operation. In the dicing operation wafers are mounted on an adhesive film and the wafer is placed in a diamond saw apparatus. The diamond saw apparatus cuts the wafer to separate the dies from each other.

After separation from the wafer individual die are ready for packaging or for otherwise connecting one die to another to form a desired system or device. To package the die, each die is removed from the adhesive substrate and placed on a lead frame. A lead frame includes a plurality of finger-like connections that extend from the periphery of the lead frame toward a center die pad. The die is mounted on the center die pad. Next, wire bonds are formed between bond pads on the die and the lead fingers of the lead frame. Thereafter, the individual die are encapsulated in plastic during a molding operation. As an alternative, the lead frame with the attached die may be mounted in a ceramic package which is then hermetically sealed. Still another alternative is to directly mount the die onto a printed circuit board that contain other die which are interconnected to form an electronic system, such as a computer.

One technique for surface mounting dies on printed circuit boards uses a solder-bump interconnection. With that technique, the bond pads of the die have solder bumps or other wettable metal terminals deposited on the bond pads of the die. The die is mounted face side down onto a printed circuit board where the solder bumps of the die are aligned to electrical contacts on the board. In a typical application, the electrical contacts are metal lands that are recessed between raised glass walls. The solder-bump forms a collapsible wall of solder. The glass dam material helps retain the solder when the solder is heated.

Such surface mountable techniques can be used without packaging the die in protective plastic or ceramic encapsulating material. As such, surface mountable techniques reduce the number of steps in fabrication of electronic systems such as computers. However, one of the drawbacks with current surface mountable techniques is that the printed circuit board receives only a single layer of die.

Accordingly, there is a need for a surface mountable technique with higher die density and multiple layers of die. In particular, there is a need for surface mounted technique and surface mounted devices which are stackable, one on top of the other. There is a need for a surface mounted technique and surface mounted apparatus where one die may be directly connected to another die using contacts on both the front and back surface of each die.

SUMMARY OF THE INVENTION

The invention provides a die and a method of fabricating a die with edge connectors. The edge connected surface mountable die has a number of fingers formed in the outside edges of the die. These fingers are separated from the body of the semiconductor material of the die by an insulating layer, typically silicon dioxide. Such edge connectors are formed by etching a stringer region enclosing the die on the wafer. The stringer region has a plurality of fingers that extend from the stringer region inward toward the integrated circuit. The stringer region is formed adjacent to the scribe region that separates one die from another. The stringer region and its fingers are formed of metal. The metal is deposited by suitable pattern operation and extends from the first or top surface of the integrated circuit to a predetermined or controlled depth with respect to the second surface of the die or wafer. The stringer is an intermediate structure which, after the fingers are suitably formed, can be removed. The fingers are then coated with solder which can be reflowed to establish an edge connection on a surface mountable printed circuit board or other surface mountable substrate.

DESCRIPTION OF THE DRAWINGS

FIGS. 12–13 are section views showing alternative processing steps for the process and structure of FIGS. 1–11.

FIG. 14 shows a perspective view of two dies fabricated in accordance with the invention. The dies are connected to a substrate along three edges and connected to each other along the fourth edge.

FIGS. 15 and 16 show perspective views of dies fabricated in accordance with the invention and mounted to a substrate in a perpendicular direction.

DETAILED DESCRIPTION

Figure 1:
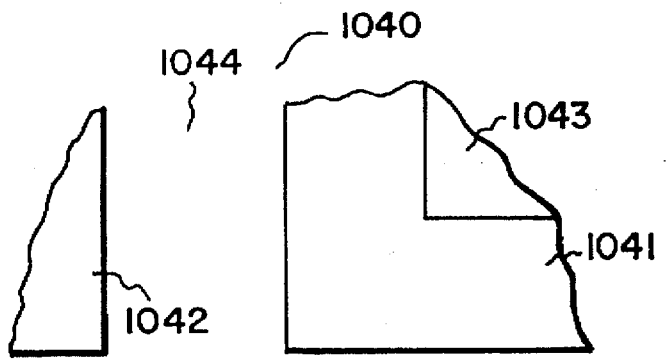
FIG. 1–11 are a combination of section and plan views of integrated circuit dies illustrating an embodiment of the invention where die edge connections are fabricated.
Figure 2:
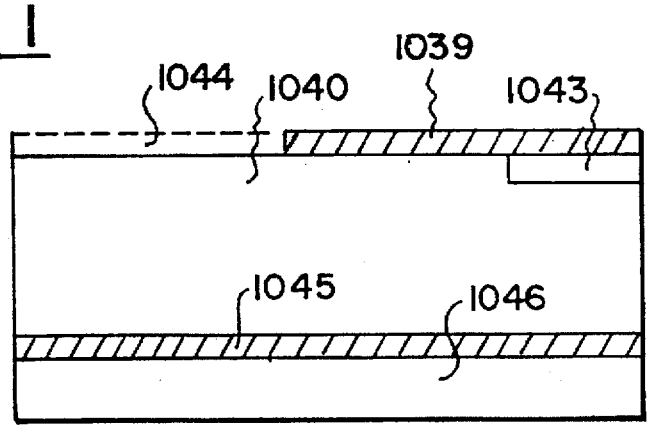

In FIGS. 1–13 there is shown and described a die edge connection embodiment of the invention. With reference to FIGS. 1 and 2 there are shown, respectively, plan and section views of a portion of wafer 1040 with adjoining die 1041, 1042. Each die has a top oxide 1039 and a bottom oxide 1045. Each die also has a circuit area 1043. The respective circuit areas 1043 are spaced from a scribe line region 1044 disposed between dies 1041 and 1042. The device wafer 1040 is supported by the handle wafer 1046 via the oxide bonding layer 1045 on the bottom side of device wafer 1040.

Figure 3:
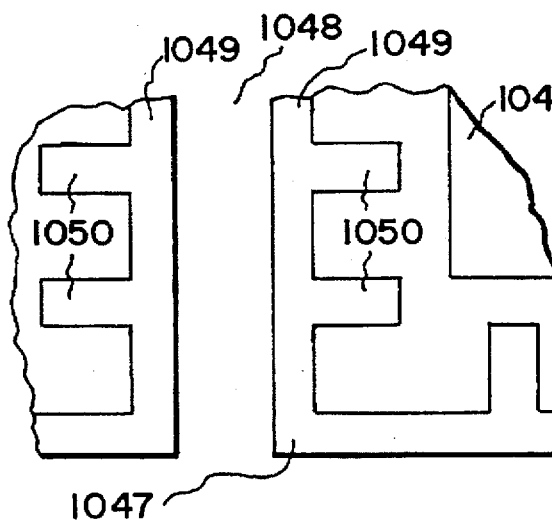
Figure 4:
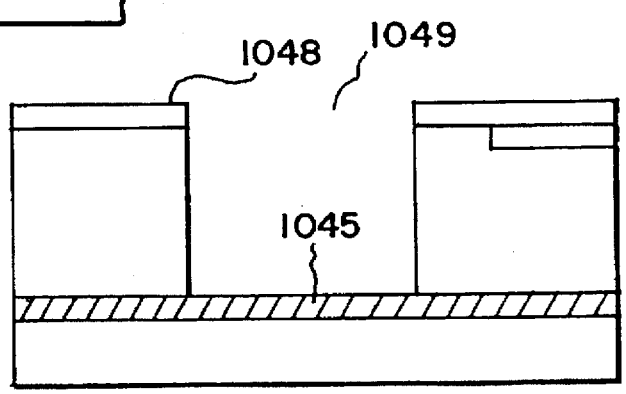

With reference to plan view FIG. 3, masking and etching operations are used to define a trenched region 1049 surrounding each die. The trenched region 1049 terminates on the bonding oxide 1045, as shown in section view FIG. 4. The region 1049 comprises a first stringer region 1047 and lead finger regions 1050. As such, the pattern defined by the region 1049 resembles a lead frame used in many packages with the lead finger regions 1050 connected together by a stringer region 1047. Stringer regions 1049 of adjacent die 1041, 1042 overlap into the scribe region 1044 resulting in a reduced scribe region 1048.

Figure 5:
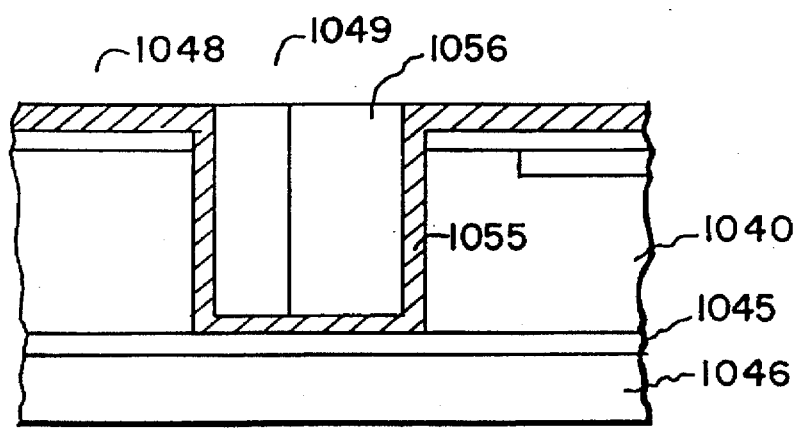

With reference to FIG. 5, the next step involves oxidation of the trench sidewalls to provide a sidewall oxide layer 1055 covering the sidewalls of the trench 1049 and the top surface of the wafer 1040. The sidewall oxide 1055 may be either thermal or deposited oxide or a combination thereof. After completion of the sidewall oxide, a metal 1056 fills the trench 1049. The metal 1056 in the preferred embodiment is tungsten, but other metals may also be used. The tungsten 1056 if deposited using CVD, completely filling the trench 1049. Portions of the tungsten 1056 deposited on the surface of the wafer are removed using chemical-mechanical planarization.

Figure 6:
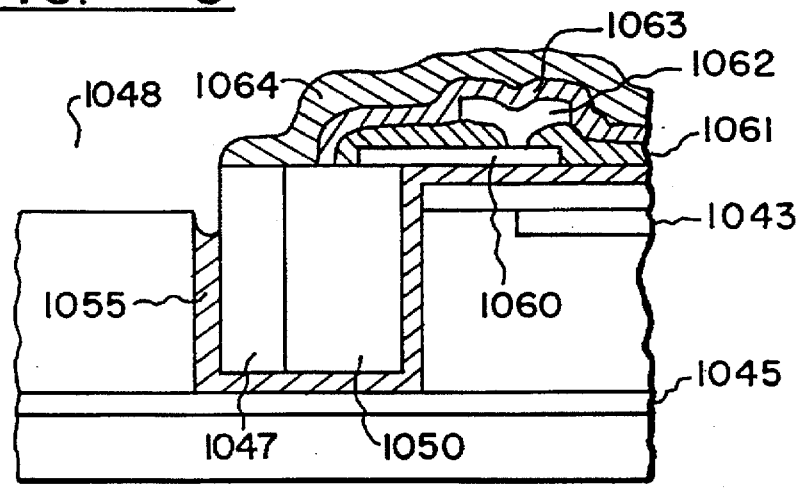

With reference to FIG. 6, the circuit area 1043 is further processed to form contact openings (not shown) to circuit elements, first and second levels of metal 1060, 1062 and an interlevel dielectric and passivation layers 1061, 1063. The first level of metal 1060 is used to connect the tungsten finger region 1050 with other levels of metalization or with the circuit area 1043. Next, a protective coating 1064 is deposited over the die and the top of the tungsten filled trench 1056 and reduced scribe regions 1048. Masking and etching operations are then used to remove the protective coating 1064 from the reduced scribe region 1048 so that the edge of the protective coating 1064 corresponds to the outside edge of the tungsten refilled trench 1049. The protective coating 1064 may comprise any suitable material such as a photosensitive polyamide. After patterning the protective coating 1064, all oxide is removed from the reduced scribe area 1048 using either wet or plasma etching.

Figure 7:
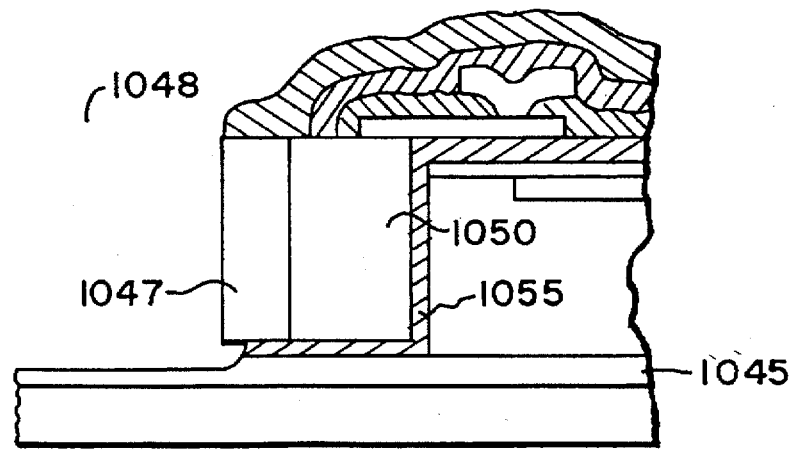

As a next step the portion of silicon wafer 1040 in the reduced scribe region 1048 is etched and the portion of sidewall oxide 1055 adjacent to the tungsten stringer region 1047 is removed, as shown in FIG. 7. To etch the silicon in the reduced scribe area 1048, a solution of KOH is used. The sidewall oxide 1055 is removed using a wet etch of dilute HF. Complete removal of the sidewall oxide 1055 from the outside surface of the tungsten stringer 1047 also results in removal of a portion of the bond oxide 1045 in the reduced scribe region 1048. After removal of the sidewall oxide 1055, the entire outer surface of the tungsten stringer 1047 of each die is exposed.

Figure 8:
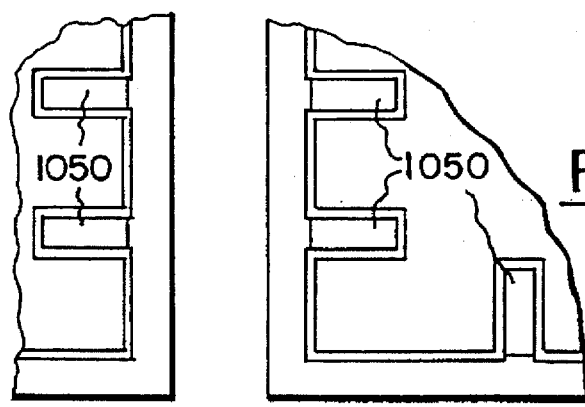
Figure 9:
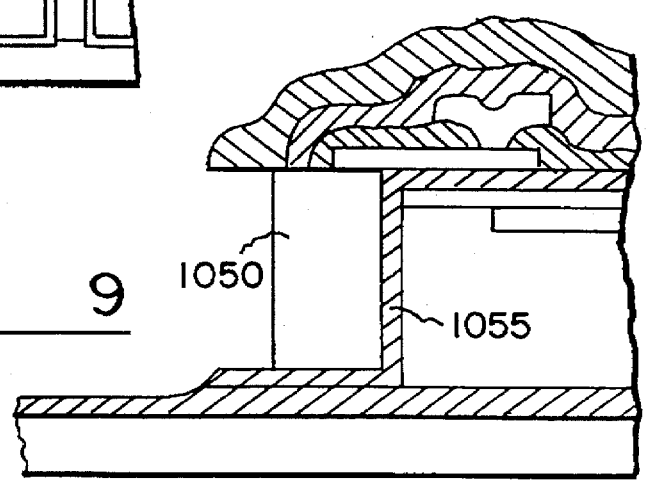
Figure 10:
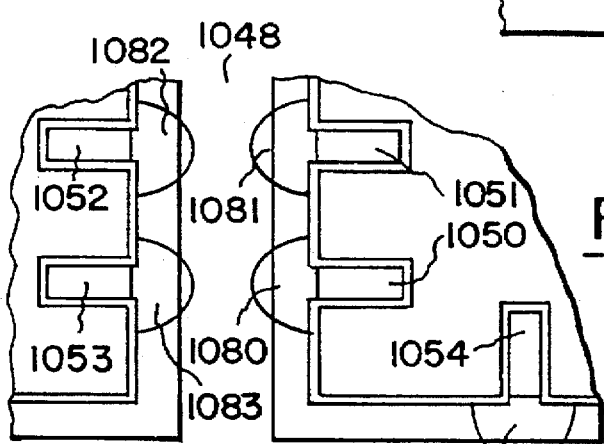
Figure 11:
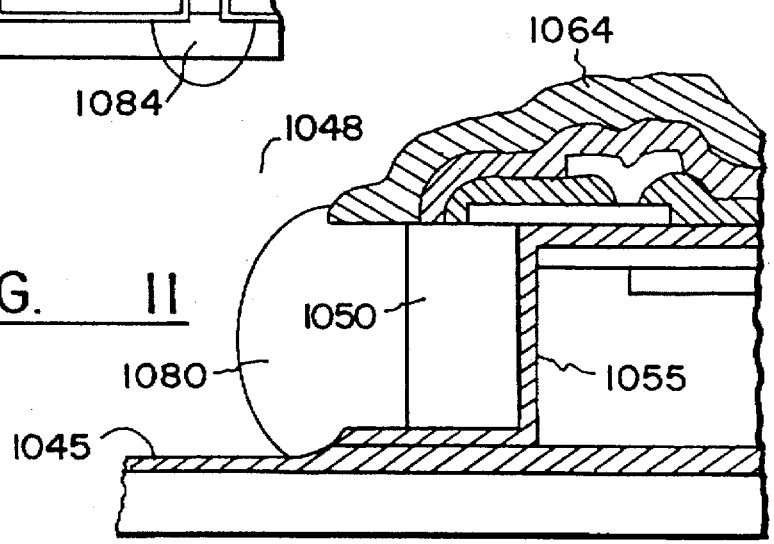

With reference to plan and section views, FIGS. 8, 9, respectively, the next step of the process is the removal of the tungsten stringer 1047 and the corresponding stringers of other die. Stringer removal is accomplished using a wet etch of hydrogen peroxide. The etch proceeds until the stringer is removed and the tungsten fingers 1050 are isolated. This etch is a timed etch so that the tungsten stringers 1047 are removed until the sidewall oxide 1055 on the inner surfaces of the stringer portion of the trench is exposed. As a further step shown in FIGS. 10, 11 a nickel or gold bump 1080 are applied to the tungsten leads 1050, 1051, 1052, etc. The contact bumps 1080 or castellations are deposited by providing an electroless plating of nickel or gold to the desired thickness onto the exposed tungsten.

After the bumps 1080 are formed, the dry oxide etch is used to remove the remaining bond oxide 1045 from the reduced scribe regions 1048. Each die 1041, 1042, etc. is then electrically probed for test purposes by contacting part of the edge bumps 1080–1084 which extends beyond the protective coating 1064. Die separation is accomplished by mounting the wafer topside down on sticky tape or any other suitable substrate and using a wet etch to remove the remnants of the handle wafer 1046.

The above embodiment is also subject to several variations. For example, the passivation layer 1063 could serve as the protective coating 1064 so long as the composition of the passivation layer 1063 will resist the various etching processes used in the reduced scribe region 1048, including Si etching, oxide etching, tungsten etching, etc. The material 1056 filling the trenches could also be polysilicon instead of tungsten. However, void free filling is required. Instead of the hydrogen peroxide etch used to remove the tungsten stringer, a KOH etch would be used to remove the polysilicon stringer. With reference to FIGS. 12, 13 if a deposited oxide 1055 is used for the trench sidewall passivation, a dry plasma etch may be used to form oxide spacers so that only the sidewalls are passivated and there is no deposited oxide on the bond oxide layer 1045. The formation of the spacer sidewall passivation will be desirable if the deposited oxide thickness and composition are otherwise not compatible with the remainder of the wafer fabrication.

It is also possible to connect two or more die along a common edge, as shown in FIG. 14 for example. After placement of the dies 1041, 1042 on a common substrate 1070 with mating edges in close proximity, application of heat is used to reflow connections to the substrate 1080 as well as die-to-die connections 1085. Substrate connections 1080 serve to connect each of the integrated circuit die 1041, 1042 with interconnect 1090 on the substrate 1070. Die-to-die interconnections 1085 connect between die 1041 and die 1042 and do so with or without also connecting to substrate metalization 1090. A unique feature of this type of die-to-die and die-to-substrate interconnection is the capability for connecting a first die to a second die or substrate with a surface which does not lie in the same plane as the first die. Several examples of this are shown in FIGS. 15, 16. FIG. 15 shows a first die 1141 connected to a substrate 1170. The surface of die 1141 is perpendicular to the surface of the substrate 1170. Edge connections 1180 on the die 1141 are reflow-connected to metalization lines 1190 on the substrate 1170. The flexibility of this type of interconnection is illustrated in FIG. 16. A plurality of dies 1141a–1141e are mounted onto substrate 1170. Each of the integrated circuit dies 1141a–1141e has edge connections 1180 which contact metalization lines 1190 on the substrate 1170. The metalization lines 1190 connect to bondpads 1160 or integrated circuit elements (not shown) on the substrate 1170. The structure shown in FIG. 10–16 can be utilized to create a high density memory module, for example, where each of the dies 1141a–1141e are DRAM integrated circuits which are interconnected onto a base substrate 1170. The base substrate can be connected to a package in the conventional manner using bondwires.

Although the present invention has been described and illustrated in detail, it is to be clearly understood that the same is by way of illustration and example only, and is not to be taken by way of limitation. The spirit and scope of the present invention are to be limited only by the terms of the appended claims.

What I claim:

1. An integrated circuit die with edge connectors comprising:

a die of semiconductor material with first and second surfaces, an integrated circuit formed in the first surface, said die having an edge region with one or more edge surfaces disposed transverse to the first and second surfaces of the die, said edge region enclosing said integrated circuit;

a plurality of edge leads, each edge lead comprising a conductive material, each edge lead having a controlled length extending in a first direction from the edge region toward the integrated circuit and having a controlled depth extending in a second direction along an edge surface and transverse to the first direction;

a dielectric layer disposed between each lead and the semiconductor material of the die;

a conductive layer connecting the integrated circuit to the leads on the edge of the die.

2. The integrated circuit of claim 1 wherein the edge leads are coated with a reflowable solder material.

3. The integrated circuit of claim 1 wherein the conductive material of the leads is polysilicon.

4. The integrated circuit of claim 3 wherein the polysilicon is silicided.

5. The integrated circuit of claim 1 wherein the conductive material of the leads is metal.

6. The integrated circuit of claim 1 wherein the conductive material is a material selected from the group consisting of tungsten, copper, and titanium nitride.

7. The integrated circuit of claim 1 wherein the dielectric is silicon dioxide.

8. A system for interconnecting two or more dies containing integrated circuits, each integrated circuit comprising:

a die of semiconductor material with first and second surfaces, an integrated circuit formed in the first surface, said die having an edge region with one or more edge surfaces disposed transverse to the first and second surfaces of the die, said edge region enclosing said integrated circuit;

a plurality of edge leads spaced apart from each other a controlled distance, each edge lead comprising a conductive material, each edge lead having a controlled length extending in a first direction from the edge region toward the integrated circuit and having a controlled depth extending in a second direction along an edge surface and transverse to the first direction;

a dielectric layer disposed between each lead and the semiconductor material of the die;

a conductive layer connecting the integrated circuit to the leads on the edge of the die; and a printed circuit board having a planar surface comprising a plurality of circuit traces, said circuit traces being spaced apart from each other by a distance corresponding to the the distance between adjacent edge leads of said dies; wherein said dies are coupled by their respective edge leads to the circuit traces on the printed circuit board.

9. The system of claim 8 wherein the dies are generally transverse to the planar surface of the printed circuit board.

* * * * *